US009041119B2

(12) United States Patent
Donegan, Jr. et al.

(10) Patent No.: US 9,041,119 B2
(45) Date of Patent: May 26, 2015

(54) FORMING CMOS WITH CLOSE PROXIMITY STRESSORS

(75) Inventors: Desmond J. Donegan, Jr., Poughkeepsie, NY (US); Abhishek Dube, Belmont, CA (US); Steven Jones, Balton Spa, NY (US); Jophy S. Koshy, Wappingers Falls, NY (US); Viorel Ontalus, Danbury, CT (US)

(73) Assignees: International Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 426 days.

(21) Appl. No.: 13/465,159

(22) Filed: May 7, 2012

(65) Prior Publication Data

US 2013/0295740 A1 Nov. 7, 2013

(51) Int. Cl.
*H01L 29/02* (2006.01)
*H01L 29/78* (2006.01)
*H01L 29/66* (2006.01)

(52) U.S. Cl.
CPC ...... *H01L 29/7848* (2013.01); *H01L 29/66636* (2013.01)

(58) Field of Classification Search
CPC ............... H01L 29/7848; H01L 29/66636; H01L 29/823814; H01L 21/02529
USPC .............. 257/373, 374, 507, E21.131, 219, 257/27.062, 29.128, 246
See application file for complete search history.

(56) References Cited

U.S. PATENT DOCUMENTS

| 7,612,389 | B2 | 11/2009 | Lin et al. | |
| 7,622,344 | B2* | 11/2009 | Liang et al. | 438/222 |
| 7,736,957 | B2 | 6/2010 | Grudowski et al. | |
| 7,875,511 | B2* | 1/2011 | Yaocheng et al. | 438/199 |
| 7,960,798 | B2 | 6/2011 | Luo et al. | |
| 7,989,298 | B1 | 8/2011 | Chan et al. | |
| 8,198,685 | B2* | 6/2012 | Liu et al. | 257/369 |
| 8,546,219 | B2* | 10/2013 | Wehella-Gamage et al. | 438/270 |
| 8,679,910 | B2* | 3/2014 | Ming et al. | 438/224 |
| 2006/0076628 | A1* | 4/2006 | Anderson et al. | 257/373 |
| 2006/0157733 | A1* | 7/2006 | Lucovsky et al. | 257/192 |
| 2008/0224218 | A1* | 9/2008 | Liu et al. | 257/351 |
| 2009/0023258 | A1* | 1/2009 | Liang et al. | 438/222 |
| 2010/0207175 | A1 | 8/2010 | Suryagandh et al. | |
| 2010/0230758 | A1 | 9/2010 | Chang et al. | |
| 2011/0117732 | A1* | 5/2011 | Bauer et al. | 438/507 |
| 2012/0001238 | A1 | 1/2012 | Tsai et al. | |
| 2012/0261672 | A1* | 10/2012 | Chidambarrao et al. | 257/77 |
| 2013/0095619 | A1* | 4/2013 | Wehella-Gamage et al. | 438/164 |

* cited by examiner

*Primary Examiner* — Michael Lebentritt
(74) *Attorney, Agent, or Firm* — Yuanmin Cai (57) ABSTRACT

A method of forming transistors with close proximity stressors to channel regions of the transistors is provided. The method includes forming a first transistor, in a first region of a substrate, having a gate stack on top of the first region of the substrate and a set of spacers adjacent to sidewalls of the gate stack, the first region including a source and drain region of the first transistor; forming a second transistor, in a second region of the substrate, having a gate stack on top of the second region of the substrate and a set of spacers adjacent to sidewalls of the gate stack, the second region including a source and drain region of the second transistor; covering the first transistor with a photo-resist mask without covering the second transistor; creating recesses in the source and drain regions of the second transistor; and forming stressors in the recesses.

20 Claims, 9 Drawing Sheets

FORMING CMOS WITH CLOSE PROXIMITY STRESSORS

FIELD OF THE INVENTION

The present invention relates generally to the manufacturing of semiconductor devices and, in particular, to the manufacturing of transistors having stressors of close proximity to channel region of the transistors.

BACKGROUND

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. A FET may further be a PFET doped with p-type dopant or an NFET doped with n-type dopant. Recently, high-k metal gate (HKMG) semiconductor transistors have been widely adopted because of their superior performance over conventional poly-based CMOS-FET. In addition, a replacement metal gate (RMG) process has been developed for manufacturing HKMG transistors with further enhanced performance.

It is generally known that performance of a transistor may be greatly improved by introducing stresses in the channel region of the transistor. This is mainly because stresses increase the mobility of carriers, either holes or electrons depending on the type (n-type or p-type) of the transistor, thereby increasing the response speed of the transistor. There are many different approaches of applying stresses to the channel region of a transistor. For example, appropriate types of stressors may be formed to be embedded in the source and drain regions of a transistor that apply stresses toward the channel region in-between the source and drain regions.

In forming source and drain with embedded stressors, recesses are normally first created in the source and drain regions, which is then followed by epitaxial growth of stressor making materials, such as silicon-germanium (SiGe) for PFET transistors and silicon-carbide (SiC) for NFET transistors, in the created recess regions. The embedded epitaxial material, such as SiGe or SiC, has a lattice constant that is designed to be different from that of silicon substrate. Using silicon substrate as a template, the embedded stressor materials growing with different lattice constant generate stresses, compressive or tensile, to surrounding regions including the channel region of transistors.

In a conventional process of forming recesses, for example, a hard-mask is first formed to cover both gate and source/drain region of a transistor. Portions of the hard-mask in the source/drain regions are subsequently etched away or removed through a directional etching process to expose underneath source/drain regions in order to create openings therein for forming the recesses. Recesses are next created or etched in the source/drain regions. Generally, recesses thus formed are separated from the gate of transistor by an additional distance attributed to the thickness of hard-mask remaining at the sidewalls of the gate.

Furthermore, due to the need of forming different types of stressors for different types of transistors on a same substrate, additional hard-mask layers and thus additional distances may be added to the space between the gate (and channel region underneath) and the recesses being created when each time such different stressors are formed. The added distances between the gate and the recesses further weaken the effectiveness of stressors, which are epitaxially formed inside the recesses. That negatively impacts the mobility of the charge carriers. Moreover, it counters the trend of continuous scaling down in real estate for manufacturing semiconductor devices, where real estate for source/drain regions is increasingly becoming smaller and/or narrower.

SUMMARY

Embodiment of the present invention provides a method of forming transistors with close proximity stressors to channel regions of the transistors. The method includes forming a first transistor in a first region of a substrate, the first transistor having a gate stack on top of the first region of the substrate and a set of spacers adjacent to sidewalls of the gate stack, the first region including a source region and a drain region of the first transistor; forming a second transistor in a second region of the substrate, the second transistor having a gate stack on top of the second region of the substrate and a set of spacers adjacent to sidewalls of the gate stack on top of the second region, the second region including a source region and a drain region of the second transistor; covering the first transistor with a photo-resist mask; creating recesses in the source and drain regions of the second transistor, the recesses being self-aligned to the set of spacers of the second transistor; and forming stressors in the recesses.

In one embodiment, creating the recesses includes etching the source and drain regions of the second transistor by an etching process, the etching process being selective to both the photo-resist mask and the set of spacers of the second transistor.

In another embodiment, forming the stressors in the recesses includes epitaxially growing either silicon-germanium (SiGe) or silicon-carbide (SiC) in the recesses.

In yet another embodiment, the photo-resist mask is a first mask, and the method further includes covering the stressors and the gate stack of the second transistor with a second mask; exposing the source and drain regions of the first transistor as well as the set of spacers adjacent to the sidewalls of the gate stack of the first transistor; creating recesses in the source and drain regions of the first transistor; and forming stressors in the recesses in the source and drain regions of the first transistor.

In one embodiment, the second mask is a photo-resist mask. In another embodiment, exposing the source and drain regions of the first transistor includes removing the second mask from the first transistor, thereby exposing underneath the source and region regions and the set of spacers of the first transistor.

BRIEF DESCRIPTION OF THE DRAWINGS

The present invention will be understood and appreciated more fully from the following detailed description of the invention, taken in conjunction with the accompanying drawings of which.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF PREFERRED EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure description of essences of embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIGS. 1-9 are demonstrative illustrations of a method of forming stressors having close proximity to a channel region of transistor in accordance with various embodiments of the present invention. In the below detailed description, some steps of the method may be illustratively shown by a series of cross-sectional views of the semiconductor devices under manufacturing. Some well known steps and/or processes may be intentionally omitted in order not to obscure description of essence of embodiment of present invention.

Embodiment of the present invention includes forming one or more transistors having stressors of close proximity on a channel region of the transistors in a semiconductor substrate. In particular, it includes forming transistors whose source and drain are formed through an epitaxial growth process and are embedded in the substrate. In one embodiment, the transistors may be formed, for example, on a silicon-on-insulator (SOI) substrate. However, a person skilled in the art will appreciate that embodiment of the present invention is not limited in this respect and, without deviating from the spirit of present invention, other types of substrates may be used as well.

Figure 1:
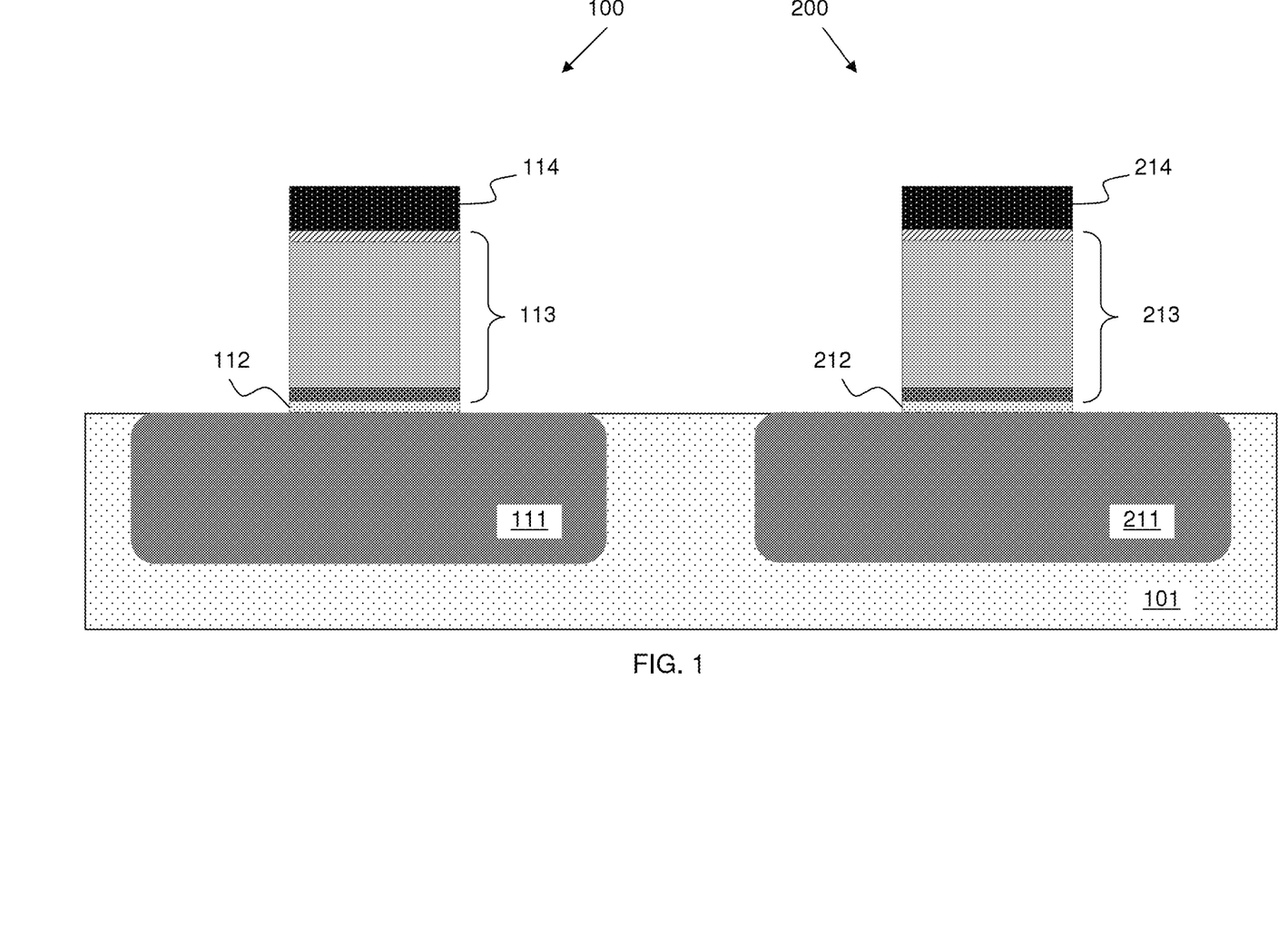
FIG. 1 is a demonstrative illustration of a method of forming stressors having close proximity to a channel region of transistor according to one embodiment of the present invention.

More specifically, FIG. 1 demonstratively illustrates forming transistors, such as transistors 100 and 200, on a silicon-on-insulator (SOI) substrate 101. According to one embodiment of the present invention, the method includes defining and/or forming one or more silicon regions, such as silicon regions 111 and 211, in substrate 101 for forming one or more different types of transistors, such as an NFET 100 and a PFET 200, respectively. However, embodiments of present invention are not limited in this aspect and other types of substrates, such as bulk substrate, may be used as well and the SOI substrate shown in the drawings are for illustration purpose only. In forming NFET 100 and PFET 200, the method includes forming a gate oxide 112 on top of silicon region 111 and subsequently a gate stack 113 on top of gate oxide 112 for NFET 100. Similarly, the method includes forming a gate oxide 212 on top of silicon region 211 and subsequently a gate stack 213 on top of gate oxide 212 for PFET 200. Hard-masks 114 and 214 may be used in the process of forming gate stacks 113 and 213, respectively. Hard-masks 121 and 221 may be optionally removed after forming gate stacks 113 and 213.

Figure 2:
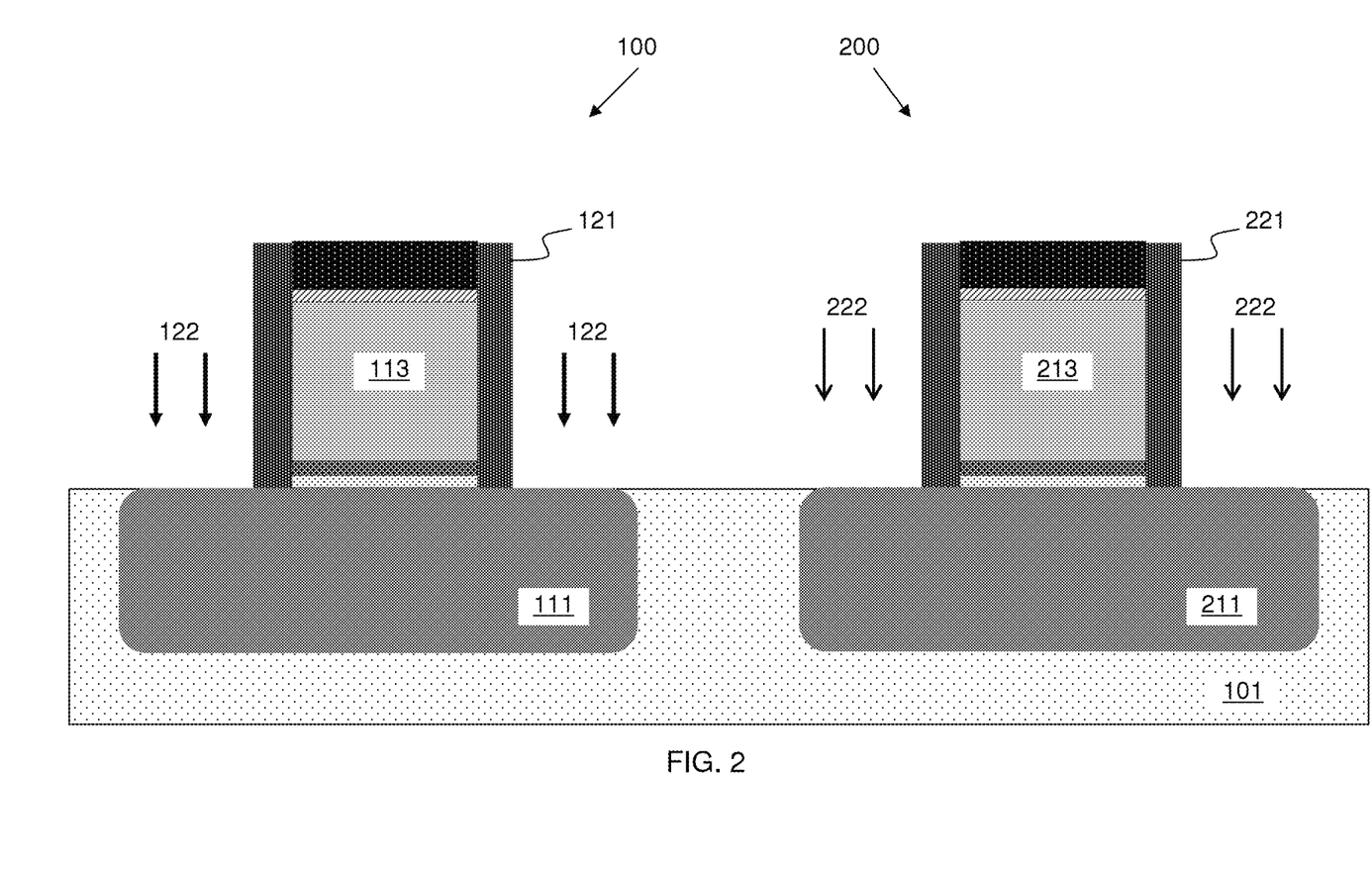
FIG. 2 is a demonstrative illustration of a method of forming stressors having close proximity to a channel region of transistor, following the steps shown in FIG. 1, according to one embodiment of the present invention.

FIG. 2 is a demonstrative illustration of a method of forming stressors having close proximity to a channel region of transistor, following the steps shown in FIG. 1, according to one embodiment of the present invention. For example, the method may include a step of forming spacers 121 at sidewalls of gate stack 113 of NFET 100 and spacers 221 at sidewalls of gate stack 213 of PFET 200. Spacers 121 and 221 may be formed by, for example, depositing a conformal or substantially conformal layer, which may be a dielectric layer, covering both gate stacks 113 and 213, and subsequently subjecting the dielectric conformal layer to a directional etching process. The directional etching process, such as a reactive-ion-etching (RIE) process, may remove most of the dielectric layer leaving only portions thereof at sidewalls of both gate stacks 113 and 213, thereby forming spacers 121 and 221. Other method or process may be used to form spacers 121 and 221 as well. Spacers 121 and 221 may also be known as offset spacers.

Following the formation of spacers 121 and 221, ion-implantation may be performed to form source/drain extensions of NFET 100 and PFET 200. For example, n-type dopant 122 may be implanted into the source/drain extension regions, to the left and right sides of gate stack 113 offset by spacers 121, of NFET 100 and p-type dopant 222 may be implanted into the source/drain regions, to the left and right sides of gate stack 213 offset by spacers 221, of PFET 200. Depending upon the nature of spacers 121 and 221, such as thickness of the spacers, angled ion-implantation maybe used in order to bring source/drain extensions close to the channel regions of transistors 100 and 200. In one embodiment, source/drain extensions may be formed through ion-implantation without the presence of spacers 121 and 221 or before the formation of spacers 121 and 221. Here, a person skilled in the art will appreciate that other variations in forming source/drain extensions may apply as well without deviating from the spirit of present invention. After ion-implantation, a rapid thermal annealing (RTA) process may be applied to the implanted regions to activate the implanted dopants.

Figure 3:
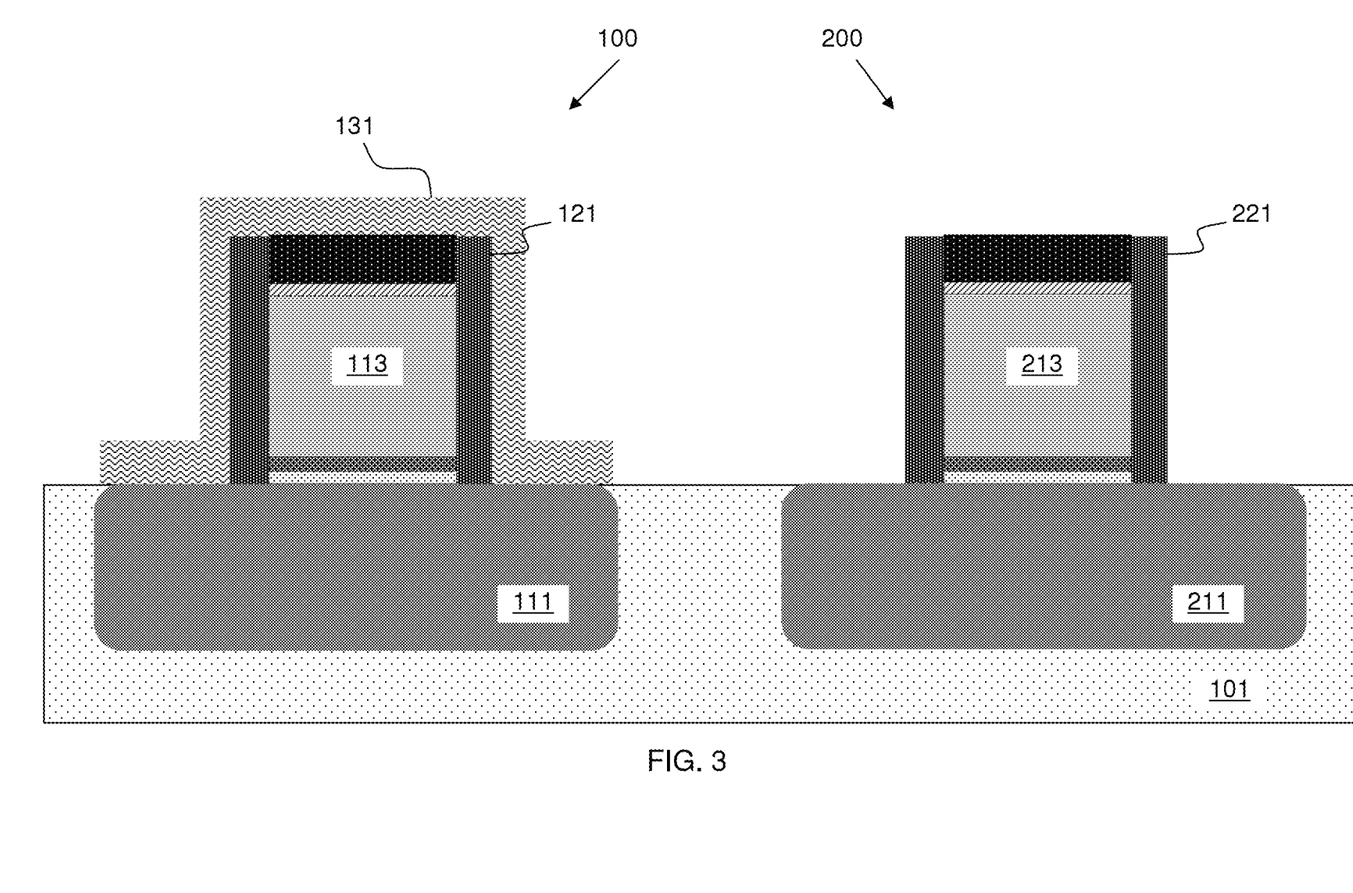
FIG. 3 is a demonstrative illustration of a method of forming stressors having close proximity to a channel region of transistor, following the steps shown in FIG. 2, according to one embodiment of the present invention.

FIG. 3 is a demonstrative illustration of a method of forming stressors having close proximity to a channel region of transistor, following the steps shown in FIG. 2, according to one embodiment of the present invention. More specifically, one embodiment of the method may include forming a soft-mask covering one type of the transistors. For example, a soft-mask 131 may be formed to cover the gate and source/drain regions of NFET 100 while the gate and source/drain regions of PFET 200 remain exposed. In forming soft-mask 131 such as a photo-resist mask, embodiment of the present invention includes applying, such as through a spinning on process, a blanket layer of photo-resist material on substrate 101 covering both types of transistors, such as NFET 100 and PFET 200, and subsequently removing a portion of the photo-resist layer such as the portion in the areas of PFET 200 through a photolithographic process, thereby forming photo-resist mask 131. Generally, most currently existing (or future developed) photo-resist materials may be used, including positive or negative types. According to one embodiment, the photo-resist mask 131 is expected to be tolerable and mostly unaffected by a subsequent step of silicon etching process, such as a RIE process, as being described below in more details.

Conventionally, in order to form stressors in source and drain regions of a transistor, both types of transistors are first covered by a hard-mask, such as a silicon-nitride hard-mask. Source and drain regions of one type of transistors are then exposed by removing the hard-mask on top thereof through a directional etching process such as a RIE process. However, this conventional approach creates a new set of spacers at the sidewalls of the transistors. The new set of spacers not only demand certain real estate spaces but causes stressors that are being formed in the source and drain regions to be further away from the channel region of the transistors, weakening the effectiveness of the stressors on the mobility of carriers. In comparison, embodiment of the present invention enables the formation of stressors right next to the original spacers 221 because of the removal of photo-resist material around gate stack 213 of PFET 200. In other words, embodiment of present invention enables the formation of stressors as close as possible to the channel region of transistors without introducing further spacing therein-between, as being described below in further details.

Figure 4:
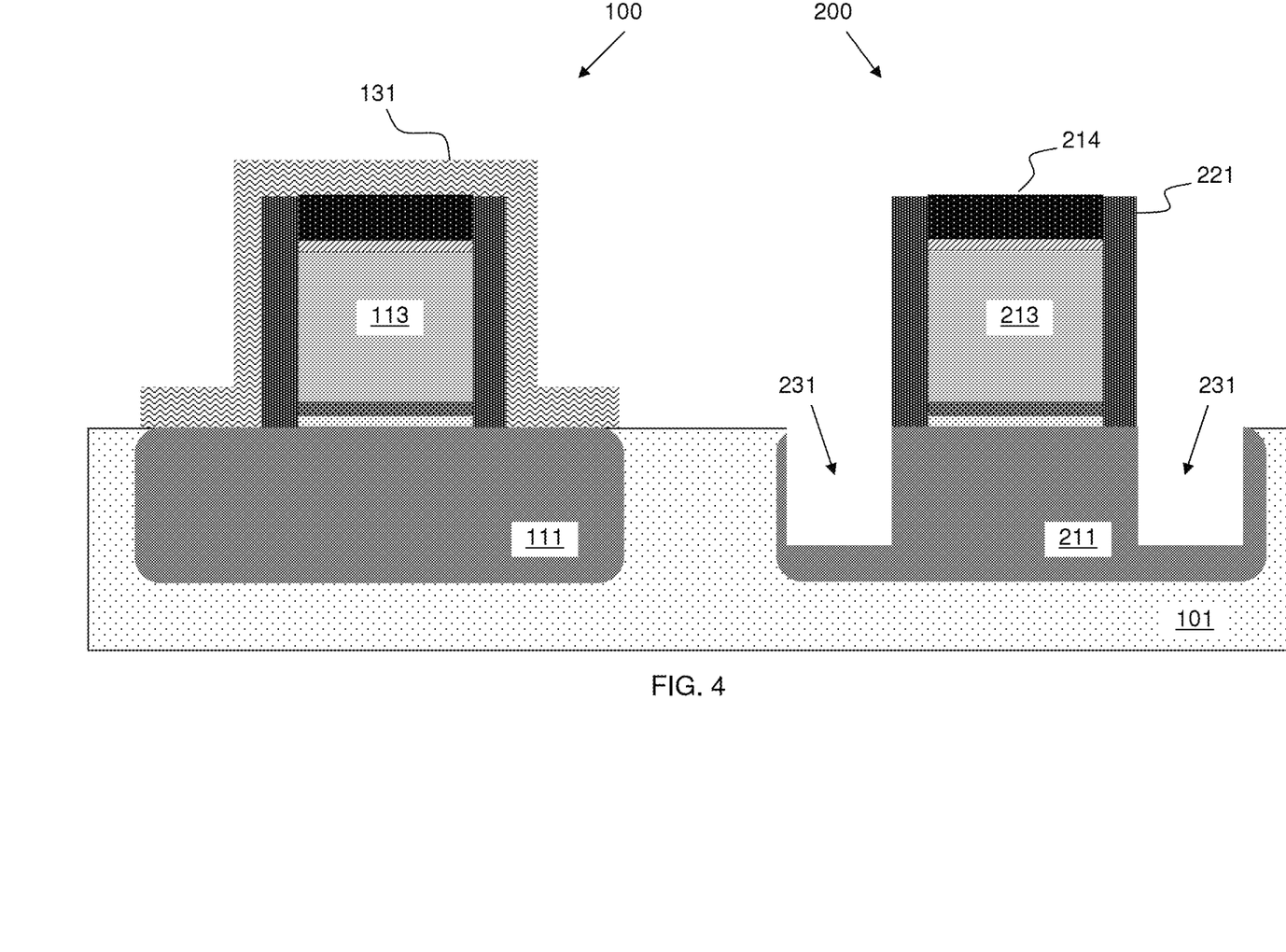
FIG. 4 is a demonstrative illustration of a method of forming stressors having close proximity to a channel region of transistor, following the steps shown in FIG. 3, according to one embodiment of the present invention.

FIG. 4 is a demonstrative illustration of a method of forming stressors having close proximity to a channel region of transistor, following the steps shown in FIG. 3, according to one embodiment of the present invention. More specifically, embodiment of the method includes creating recesses 231 of source and drain regions of PFET 200, while source and drain regions of NFET 100 is protected by photo-resist mask 131. In forming recesses 231, embodiment of the method includes applying an etching process to etch source/drain regions of PFET 200. The etching process, such as a RIE process, is selective to hard-mask 214 and sidewall spacers 221, of material such as silicon-nitride, such that gate stack or structure 213 remains substantially intact during the creation of recesses 231. Recesses 231 formed thereby may be self-aligned to spacers 221 of gate structure 213.

Figure 5:
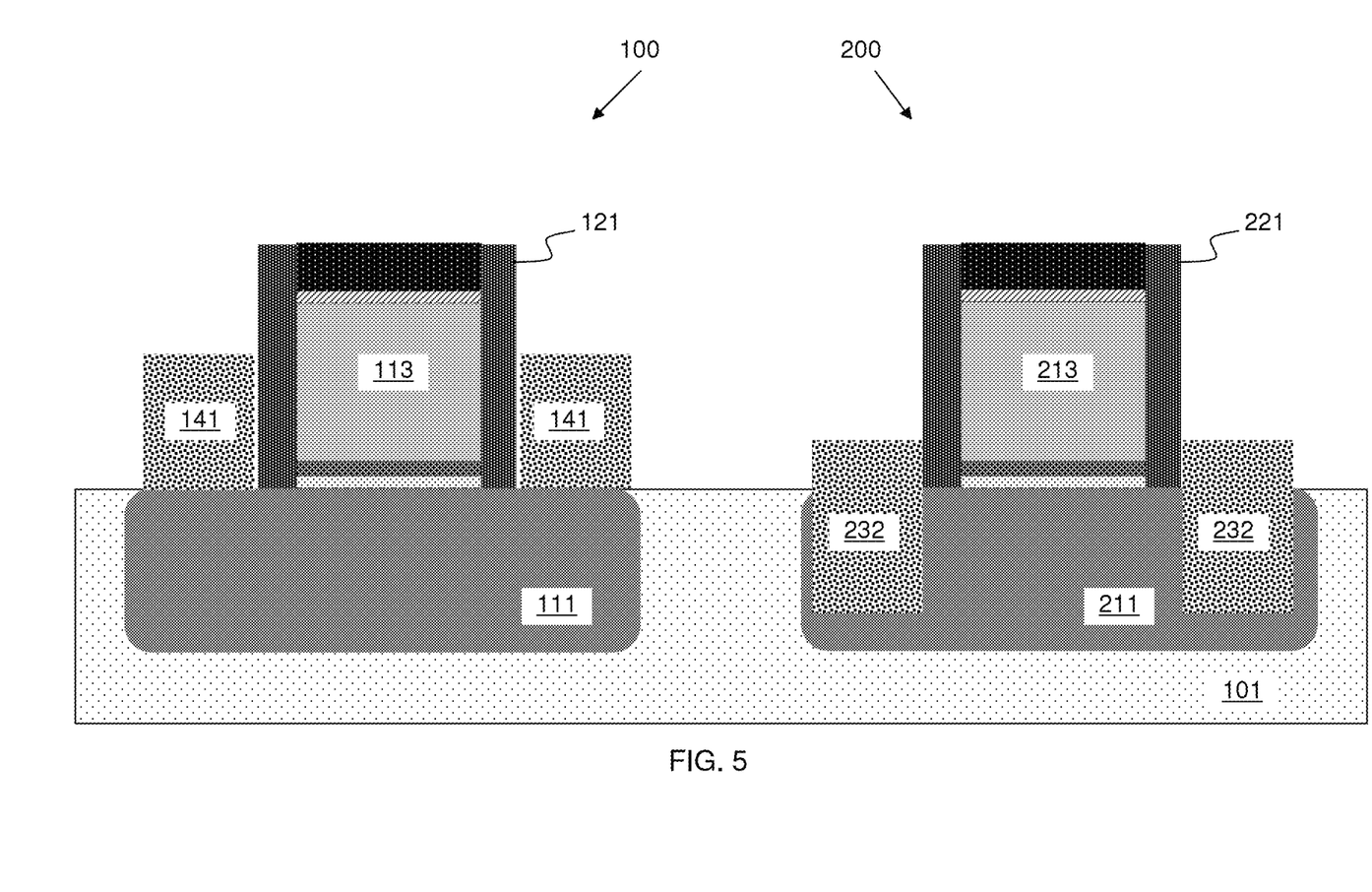
FIG. 5 is a demonstrative illustration of a method of forming stressors having close proximity to a channel region of transistor, following the steps shown in FIG. 4, according to one embodiment of the present invention.

FIG. 5 is a demonstrative illustration of a method of forming stressors having close proximity to a channel region of transistor, following the steps shown in FIG. 4, according to one embodiment of the present invention. Following the formation of recesses 231 in the source and drain regions of PFET 200, photo-resist mask 131 that covers NFET 100 may be removed by any conventional and/or future developed technique. Stressors 232 may be formed through epitaxial growth, for example, in recesses 231 next to the channel region of PFET 200. For example, silicon-germanium may be formed as stressors 232, filling up the space of recesses 231, in substrate 101 next to channel region of PFET 200 underneath gate stack 213. The bottom and sidewalls of recesses 231, of silicon material, provide a growth template for the formation of epitaxial silicon-germanium stressors 232. Once above the top surface of substrate 101, the rate of growth may slow due to reduced template and epitaxial film will not form from sidewalls of spacers 221 due to material difference.

During the epitaxial growing process of forming stressors 232, silicon-germanium may also grow in the source/drain regions of NFET 100 as is shown in FIG. 5. Silicon-germanium 141 may epitaxially grow from the top surface of substrate 101 in the source/drain regions and next to sidewall spacers 121 of NFET 100. Although not illustrated in FIG. 6, a person skilled in the art will appreciate that gaps may exist between silicon-germanium 141 and spacers 121, as well as between stressors 232 and spacers 221.

Figure 6:
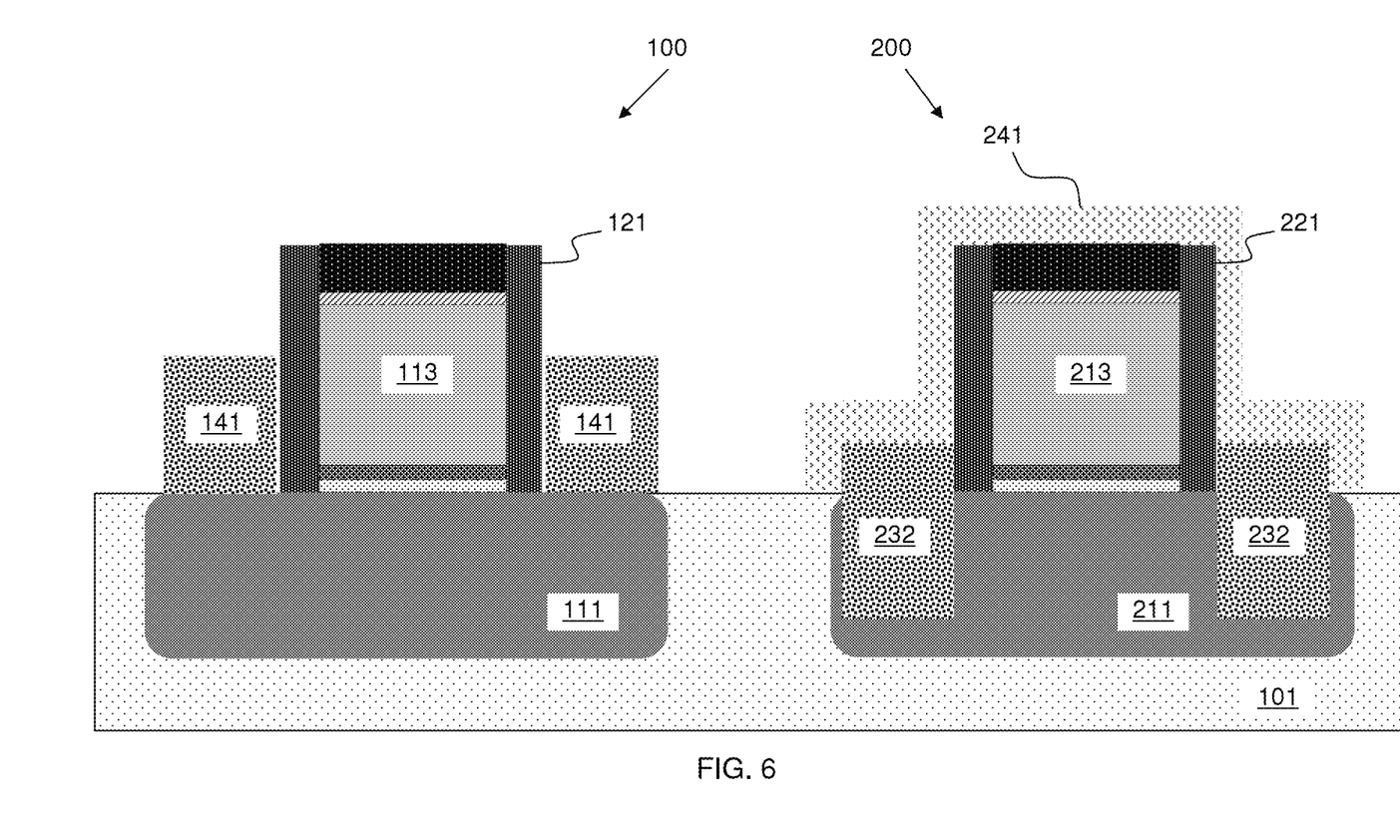
FIG. 6 is a demonstrative illustration of a method of forming stressors having close proximity to a channel region of transistor, following the steps shown in FIG. 5, according to one embodiment of the present invention.

FIG. 6 is a demonstrative illustration of a method of forming stressors having close proximity to a channel region of transistor, following the steps shown in FIG. 5, according to one embodiment of the present invention. After forming embedded stressors 232 in source/drain regions of PFET 200, PFET 200 may be covered by forming a mask 241 on top thereof thereby stressors for NFET 100 may be formed without affecting PFET 200. Different from forming photo-resist mask 131 covering NFET 100, here different types of masks may be used to cover PFET 200. For example, in one embodiment, a photo-resist mask 241 similar to photo-resist mask 131 may be formed to cover gate and source/drain regions of PFET 200 in a similar approach as forming photo-resist mask 131. In another embodiment, a hard-mask of dielectric material may be used to cover PFET 200 as well although which may cause additional spacing, when being compared with using a soft-mask such as a photo-resist mask, between the channel region of NFET 100 and stressors to be formed in source/drain regions thereof. In the following description, it is assumed that photo-resist mask 241 is used in the process of forming stressors in the source/drain regions of NFET 100.

Figure 7:
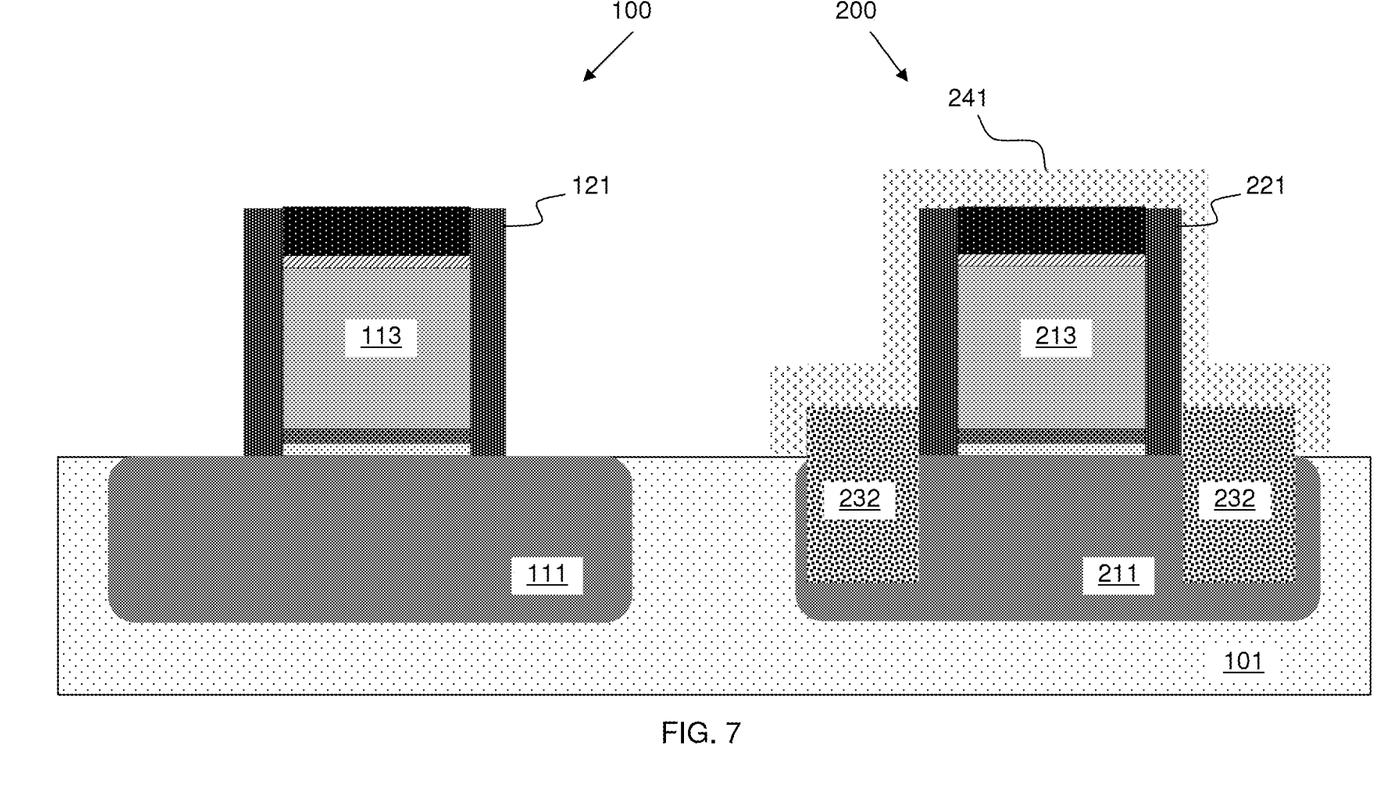
FIG. 7 is a demonstrative illustration of a method of forming stressors having close proximity to a channel region of transistor, following the steps shown in FIG. 6, according to one embodiment of the present invention.

FIG. 7 is a demonstrative illustration of a method of forming stressors having close proximity to a channel region of transistor, following the steps shown in FIG. 6, according to one embodiment of the present invention. With photo-resist mask 241 covering PFET 200, stressor materials 141, which may be formed on top of source and drain regions of NFET 100 during the course of forming stressors 232 in the source and drain regions of PFET 200, may be removed or etched away. The removal of stressor materials 141 exposes underneath source and drain regions of NFET 100 as well as sidewall spacers 121. Comparing to the conventional approach of forming embedded stressors which cause additional spacers to be formed next to spacers 121, embodiment of the present invention enables stressors to be formed right next to spacers 121, as being discussed below in more details, with no additional spacing materials being added to spacers 121.

Figure 8:
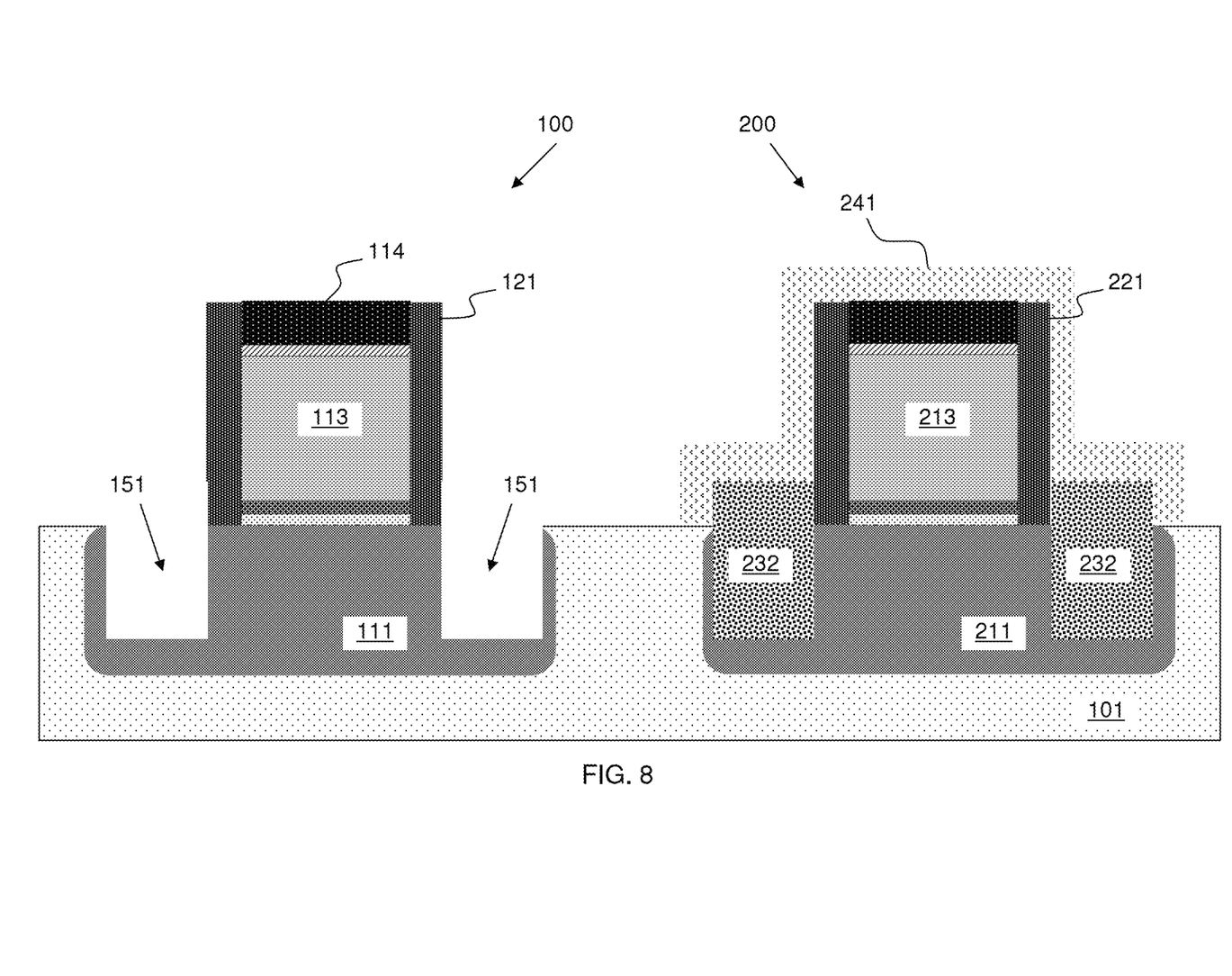
FIG. 8 is a demonstrative illustration of a method of forming stressors having close proximity to a channel region of transistor, following the steps shown in FIG. 7, according to one embodiment of the present invention.

FIG. 8 is a demonstrative illustration of a method of forming stressors having close proximity to a channel region of transistor, following the steps shown in FIG. 7, according to one embodiment of the present invention. Similar to forming stressors 232 for PFET 200 as being demonstratively illustrated in FIG. 4, according to one embodiment, method of the present invention includes etching source and drain regions of NFET 100, through a directional etching process such as a RIE process, to create recesses 151 in the silicon regions 111 of substrate 101. In one embodiment, the RIE process may be selected or adjusted to be selective to hard-mask 114 and spacers 121, which are generally dielectric material such as silicon-nitride. The RIE process is also selective to photo-resist mask 241. The etching process creates recesses 151 to the left and right of the channel region of NFET 100 without causing any damage to the gate stack 113 of NFET 100, and with PFET 200 including stressors 232 in the source/drain regions being covered and protected by photo-resist mask 241.

Figure 9:
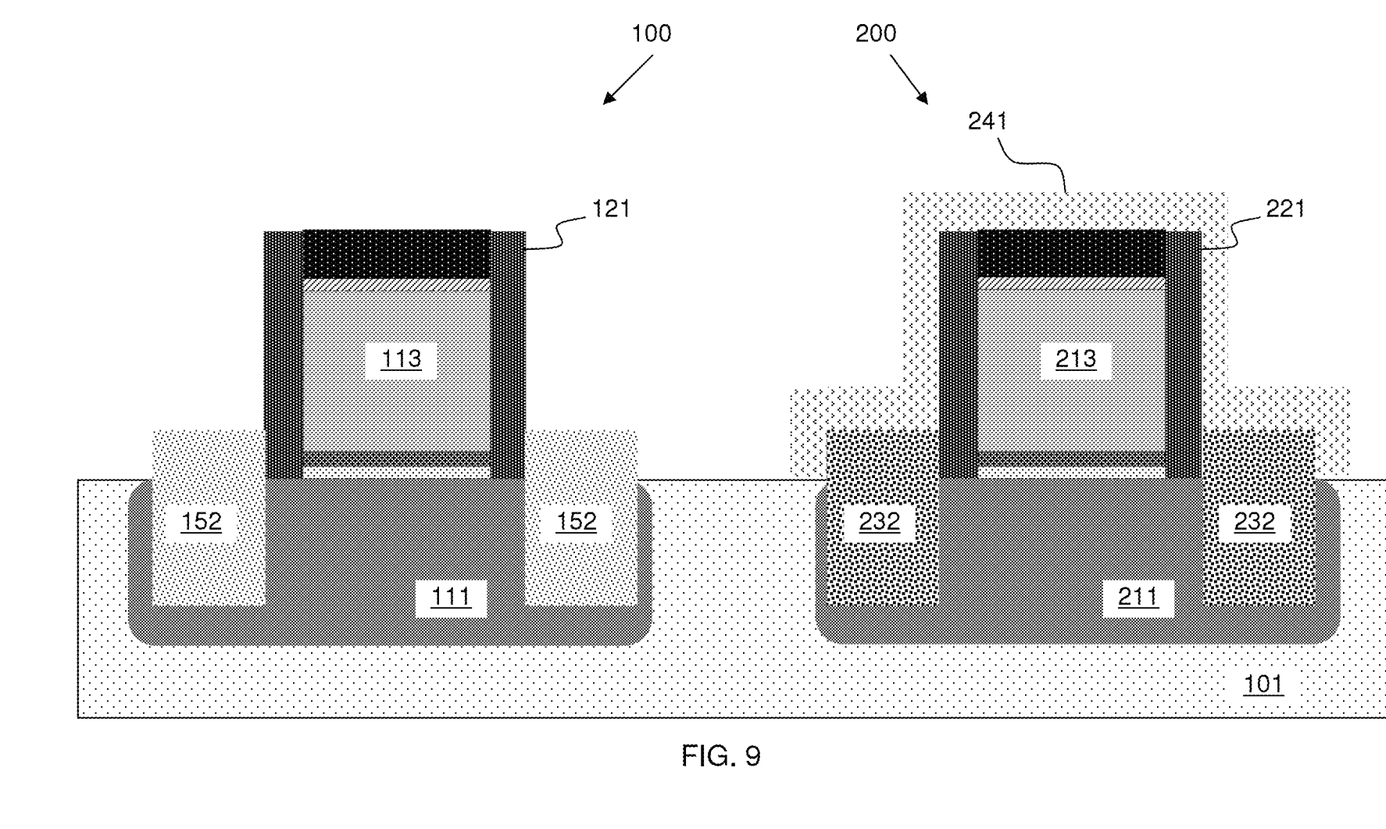
FIG. 9 is a demonstrative illustration of a method of forming stressors having close proximity to a channel region of transistor, following the steps shown in FIG. 8, according to one embodiment of the present invention.

FIG. 9 is a demonstrative illustration of a method of forming stressors having close proximity to a channel region of transistor, following the steps shown in FIG. 8, according to one embodiment of the present invention. Following the formation of recesses 151 in the source and drain regions of NFET 100, stressors 152 may be formed through epitaxial growth, for example, in recesses 151 next to the channel region of NFET 100. For example, silicon-carbide (SiC) may be formed as stressors 152, filling up the space of recesses 151, in substrate 101 next to the channel region underneath gate stack 113. Recesses 151 provide a template, at both the bottom and sidewalls thereof, for the epitaxial growth of silicon-carbide material. The rate of SiC growth, once above the top surface of substrate 101, may slow due to reduced template area.

Here, it is to be noted that embodiments of the present invention are not limited to the above description. For example, one embodiment of the present invention may include first forming stressors in the source/drain regions of a NFET, then forming stressors in the source/drain regions of a PFET. In other word, the above exemplary description of processes of forming stressors may be applied to situations where transistor 100 is a PFET and transistor 200 is a NFET. Silicon-germanium stressors (or other suitable stressors) may be formed for PFET 100 and silicon-carbide stressors (or other suitable stressors) may be formed for NFET 200.

While the invention has been described in terms of exemplary embodiments, those skilled in the art will recognize that the invention can be practiced with modifications and in the spirit and scope of the appended claims.

What is claimed is:

1. A method comprising:
    forming a first transistor in a first region of a substrate by forming a first gate stack on top of said first region of said substrate, said first region including a source region and a drain region of said first transistor;
    forming a second transistor in a second region of said substrate by forming a second gate stack on top of said second region of said substrate, said second region including a source region and a drain region of said second transistor;
    covering said first transistor with a mask, said mask does not cover said second transistor;
    creating recesses in said source and drain regions of said second transistor;
    removing said mask from said first transistor; and
    forming stressors in said recesses through an epitaxial growing process, said epitaxial growing process causes silicon-germanium or silicon-carbide to be epitaxially formed on top surfaces of said source and drain regions, of said first transistor, that are exposed after removing said mask.

2. The method of claim 1, wherein said mask is a photo-resist mask and wherein covering said first transistor with said photo-resist mask comprises applying a layer of photo-resist material through a spinning on process covering said first transistor and said second transistor, and then removing a portion of said layer of photo-resist material through a photo-lithographic process, said portion of said layer of photo-resist material covering said second transistor.

3. The method of claim 2, wherein said first gate stack having a first set of spacers at sidewalls thereof and said second gate stack having a second set of spacers at sidewalls thereof, and wherein removing said portion of said layer of photo-resist material comprises exposing said second set of spacers at said sidewalls of said second gate stack of said second transistor.

4. The method of claim 3, wherein creating said recesses comprises etching said source and drain regions of said second transistor by a selective etching process, said selective etching process being selective to said second set of spacers of said second transistor thereby creating said recesses that are self-aligned to said second set of spacers of said second transistor.

5. The method of claim 1, wherein said second transistor is a p-type field-effect-transistor (PFET) and forming said stressors comprises epitaxially growing silicon-germanium in said recesses.

6. The method of claim 1, wherein said second transistor is a n-type field-effect-transistor (NFET) and forming said stressors comprises epitaxially growing silicon-carbide in said recesses.

7. The method of claim 1, wherein said mask is a first mask further comprising:
    covering said first transistor and said second transistor including said stressors formed in said source and drain regions of said second transistor with a second mask;
    exposing said source and drain regions of said first transistor;
    creating recesses in said source and drain regions of said first transistor; and
    forming stressors in said recesses in said source and drain regions of said first transistor.

8. The method of claim 7, wherein said second mask is a soft-mask of photo-resist material.

9. The method of claim 7, wherein exposing said source and drain regions of said first transistor comprises removing said second mask from said first transistor and removing said epitaxially formed silicon-germanium or silicon-carbide underneath said second mask, thereby exposing underneath said source and region regions and a set of spacers at sidewalls of said first gate stack of said first transistor.

10. The method of claim 9, further comprising:
    creating recesses in said source and drain regions of said first transistor that are self-aligned to said set of spacers of said first transistor; and
    forming stressors in said recesses in said source and drain regions of said first transistor.

11. A method comprising:
    forming a first transistor in a first region of a substrate, said first transistor having a gate stack on top of said first region of said substrate and a set of spacers adjacent to sidewalls of said gate stack, said first region including a source region and a drain region of said first transistor;
    forming a second transistor in a second region of said substrate, said second transistor having a gate stack on top of said second region of said substrate and a set of spacers adjacent to sidewalls of said gate stack on top of said second region, said second region including a source region and a drain region of said second transistor;
    covering said first transistor with a photo-resist mask;
    creating recesses in said source and drain regions of said second transistor, said recesses being self-aligned to said set of spacers of said second transistor;
    removing said photo-resist mask from said first transistor; and
    forming stressors in said recesses, thereby causing materials that form said stressors to be epitaxially formed on top surfaces of said source and drain regions of said first transistor.

12. The method of claim 11, wherein creating said recesses comprises etching said source and drain regions of said second transistor by an etching process, said etching process being selective to both said photo-resist mask and said set of spacers of said second transistor.

13. The method of claim 11, wherein forming said stressors in said recesses comprises epitaxially growing either silicon-germanium (SiGe) or silicon-carbide (SiC) in said recesses.

14. The method of claim 11, wherein said photo-resist mask is a first mask further comprising:
covering said stressors and said gate stack of said second transistor with a second mask;
exposing said source and drain regions of said first transistor as well as said set of spacers adjacent to said sidewalls of said gate stack of said first transistor;
creating recesses in said source and drain regions of said first transistor; and
forming stressors in said recesses in said source and drain regions of said first transistor.

15. The method of claim 14, wherein said second mask is a photo-resist mask or a hard-mask.

16. The method of claim 14, wherein exposing said source and drain regions of said first transistor comprises removing said second mask and removing said materials underneath thereof that form said stressors from said first transistor, thereby exposing underneath said source and region regions and said set of spacers of said first transistor.

17. A method comprising:
forming a first transistor in a first region of a substrate, said first transistor having a gate stack on top of said first region of said substrate and a set of spacers adjacent to sidewalls of said gate stack, said first region including a source region and a drain region of said first transistor;
forming a second transistor in a second region of said substrate, said second transistor having a gate stack on top of said second region of said substrate and a set of spacers adjacent to sidewalls of said gate stack, said second region including a source region and a drain region of said second transistor;
covering said first transistor with a first photo-resist mask;
creating a first set of recesses in said source and drain regions of said second transistor, said first set of recesses being self-aligned to said set of spacers of said second transistor;
removing said first photo-resist mask from said first transistor;
forming stressors in said first set of recesses and consequently materials that form said stressors on top surfaces of said source and drain regions of said first transistor;
covering said second transistor including said stressors with a second photo-resist mask;
creating a second set of recesses in said source and drain regions of said first transistor, said second set of recesses being self-aligned to said set of spacers of said first transistor; and
forming stressors in said second set of recesses.

18. The method of claim 17, wherein creating said first set of recesses comprises etching said source and drain regions of said second transistor by an etching process, said etching process being selective to both said first photo-resist mask and said set of spacers of said second transistor.

19. The method of claim 17, wherein forming said stressors in said first set and second set of recesses comprises either epitaxially growing silicon-germanium (SiGe) in said first set of recesses and silicon-carbide (SiC) in said second set of recesses recesses, or epitaxially growing SiC in said first set of recesses and SiGe in said second set of recesses.

20. The method of claim 17, wherein covering said first transistor with said first photo-resist mask comprises forming a layer of photo-resist material on top of said first transistor and said second transistor, and subsequently removing a portion of said layer of photo-resist material from top of said second transistor through a photo-lithographic process.

* * * * *